(12) United States Patent
Su et al.

(10) Patent No.: US 12,241,944 B2
(45) Date of Patent: Mar. 4, 2025

(54) DISTRIBUTED INSULATION DETECTION DEVICE FOR MULTI-STAGE DC SYSTEM

(71) Applicant: ZTE CORPORATION, Guangdong (CN)

(72) Inventors: Shuo Su, Guangdong (CN); Jianye Liu, Guangdong (CN); Shihao Qin, Guangdong (CN); Bao Song, Guangdong (CN); Yuhui Ye, Guangdong (CN); Min Shao, Guangdong (CN)

(73) Assignee: ZTE CORPORATION, Guangdong (CN)

( * ) Notice: Subject to any disclaimer, the term of this patent is extended or adjusted under 35 U.S.C. 154(b) by 461 days.

(21) Appl. No.: 17/629,366

(22) PCT Filed: Sep. 2, 2020

(86) PCT No.: PCT/CN2020/113059
§ 371 (c)(1),
(2) Date: Jan. 21, 2022

(87) PCT Pub. No.: WO2021/043173
PCT Pub. Date: Mar. 11, 2021

(65) Prior Publication Data
US 2022/0252680 A1 Aug. 11, 2022

(30) Foreign Application Priority Data
Sep. 6, 2019 (CN) .......................... 201910844102.4

(51) Int. Cl.
*G01R 31/52* (2020.01)
*G01R 27/02* (2006.01)

(52) U.S. Cl.
CPC ............. *G01R 31/52* (2020.01); *G01R 27/02* (2013.01)

(58) Field of Classification Search
CPC ...... G01R 31/52; G01R 27/02; G01R 27/025; G01R 31/40; G01R 17/105
See application file for complete search history.

(56) References Cited

U.S. PATENT DOCUMENTS

| 2016/0181780 | A1* | 6/2016 | Hatter | ................. E21B 41/0007 361/44 |
| 2020/0225275 | A1* | 7/2020 | Du | .......................... G01R 31/52 |

(Continued)

FOREIGN PATENT DOCUMENTS

| CN | 102830283 A | 12/2012 |
| CN | 103018614 A | 4/2013 |

(Continued)

OTHER PUBLICATIONS

ZTE Corporation, Extended European Search Report, EP 20861092.3, Jul. 19, 2022, 225 pgs.

(Continued)

*Primary Examiner* — Alesa Allgood
*Assistant Examiner* — Suresh K Rajaputra
(74) *Attorney, Agent, or Firm* — Dority & Manning, P.A.

(57) ABSTRACT

Provided is a distributed insulation detection device for a multi-stage DC system. A basic insulation combination module is configured to detect a ground insulation fault of the multi-stage DC system, a sampling module is configured to collect voltage data and/or leakage current data of the multi-stage DC system, to transmit the collected voltage data and/or the leakage current data to an intelligent control module for data processing, to control a resistance value of the basic insulation combination module and a resistance value of an intelligent resistance switching network module, so as to adjust a total balance resistance of the distributed insulation detection device for the multi-stage DC system.

14 Claims, 9 Drawing Sheets

(56) References Cited

U.S. PATENT DOCUMENTS

2021/0231726 A1* 7/2021 Du .................. G01R 27/025
2021/0231742 A1* 7/2021 Li ..................... G01R 31/14

FOREIGN PATENT DOCUMENTS

| | | | |
|---|---|---|---|
| CN | 103091596 | A | 5/2013 |
| CN | 103116107 | A | 5/2013 |
| CN | 203673005 | U | 6/2014 |
| CN | 104749441 | A | 7/2015 |
| CN | 205246760 | U | 5/2016 |
| CN | 106093739 | A | 11/2016 |
| CN | 104702208 | B | 1/2017 |
| CN | 106771901 | A | 5/2017 |
| CN | 107894558 | A | 4/2018 |
| CN | 109142993 | A | 1/2019 |
| CN | 109765495 | A | 5/2019 |
| WO | 2012120683 | A1 | 9/2012 |

OTHER PUBLICATIONS

ZTE Corporation, International Search Report with English Translation, PCT/CN2020/113059, Nov. 30, 2020, 7 pgs.

* cited by examiner

DISTRIBUTED INSULATION DETECTION DEVICE FOR MULTI-STAGE DC SYSTEM

CROSS REFERENCE TO RELATED APPLICATIONS

The present application is a United States National Stage Application filed under 35 U.S.C. § 371 of PCT Patent Application Serial No. PCT/CN2020/113059, filed Sep. 2, 2020, which claims priority to Chinese patent application No. 201910844102.4, filed Sep. 6, 2019, each of which is incorporated by reference herein in its entirety.

TECHNICAL FIELD

Embodiments of the present disclosure include, but are not limited to, the field of high-voltage direct current power supply system technology, and specifically include, but are not limited to, a distributed insulation detection device for a multi-stage DC system.

BACKGROUND

Due to the superiority of direct current (DC) power supply, a high-voltage direct current (HVDC) system has developed rapidly in fields of communication base stations, new energy and automotive electronics in recent years. The power supply of core server rooms of an Internet data center (IDC) has gradually developed from uninterruptible power system/uninterruptible power supply (UPS) to HVDC. Different from the conventional 48V communication power supply, the HVDC power supply system uses a suspended power supply, and the positive and negative busbars to ground are required to ensure a certain insulation degree. Serious damage may be caused to equipment and personal safety due to an insulation failure.

SUMMARY

Some embodiments of the present disclosure provide a distributed insulation detection device for a multi-stage DC system, which includes: an intelligent control module, and a sampling module, a basic insulation combination module and an intelligent resistance switching network module connected with the intelligent control module. The sampling module is configured to collect voltage data and/or leakage current data of the multi-stage DC system, and to transmit the voltage data and/or leakage current data to the intelligent control module. The basic insulation combination module is configured to detect a ground insulation fault of the multi-stage DC system. The intelligent resistance switching network module is configured to adjust a resistance value of the distributed insulation detection device of the multi-stage DC system. The intelligent control module is configured to process the voltage data and/or leakage current data and to control the basic insulation combination module and the intelligent resistance switching network module to make adjustment.

Other features and corresponding beneficial effects of the present disclosure are described in the later part of the specification, and it should be understood that at least part of the beneficial effects become obvious from the description in the specification of the present disclosure.

BRIEF DESCRIPTION OF THE DRAWINGS

The present disclosure will be further described below with reference to the accompanying drawings and embodiments. The accompanying drawings are as below.

DETAILED DESCRIPTION

In order to make objectives, technical solutions and advantages of the present disclosure clearer, some embodiments of the present disclosure will be explained below in detail with reference to accompanying drawings and specific embodiments. It should be understood that specific embodiments described here only explain the disclosure but do not constitute a limitation on the disclosure.

Inventors noted that: the conventional insulation monitoring technology based on a balanced bridge theory is only aimed at a single DC system, without considering a parallel connection of multiple insulation detection devices, and would no longer adapt to the increasingly diversified power supply and distribution systems. The larger the resistance of a balanced bridge, the larger the deviation amplitude of the voltage to ground and the higher the sensitivity of an insulation detection. However, the larger the resistance of the balanced bridge, the more likely the voltage to ground deviates in response to the insulation decreasing, which may cause a misoperation of a secondary equipment protection circuit before reaching an insulation resistance alarm threshold. The resistance value of the balanced bridge may neither be too small nor too large, which is generally determined by a DC voltage. Therefore, the resistance value of the balanced bridge of insulation detection devices in the same DC power supply and distribution system may be in the same order of magnitude.

Figure 1:
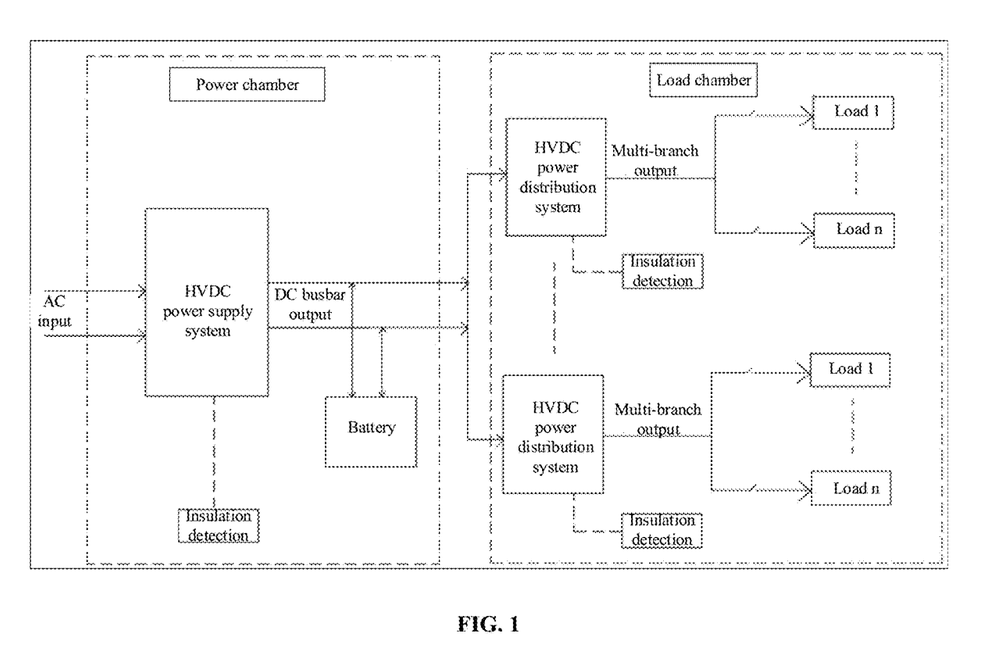
FIG. 1 is a schematic architecture diagram of a typical application of a power supply and distribution system for a multi-stage DC power supply.

A typical application of a distributed power supply and distribution system for a multi-stage DC power supply is shown in FIG. 1, which includes a HVDC power supply system, a HVDC power distribution system and multiple output branches. All stages of systems may have their own insulation detection devices. At present, in IDC server room, charging pile, photovoltaic power supply and other fields, the theory based on the balanced bridge and its change is basically used to realize insulation fault detection. Therefore, in practical applications, especially in the case that all stages of systems are provided by different manufacturers, the parallel connection of insulation detection devices may cause the actual resistance value of the balanced bridge to change, resulting in an insulation calculation deviation or even a false alarm. The current engineering measures are mostly to directly remove the interfered insulation detection devices in the parallel system, but this may not ensure the comprehensiveness of the insulation detection of the whole distributed DC power supply and distribution system. Based on this, the present disclosure proposes a distributed insulation detection method and device for a multi-stage DC system.

First Embodiment

In some situations, a current conventional insulation monitoring technology based on a balanced bridge theory is applied to a distributed power supply and distribution system of a multi-stage DC power supply, a parallel connection of insulation detection devices may cause an actual resistance value of a balanced bridge to change, resulting in an insulation calculation deviation or even a false alarm. In order to solve this problem, this embodiment provides a distributed insulation detection device for a multi-stage DC system.

Figure 2:
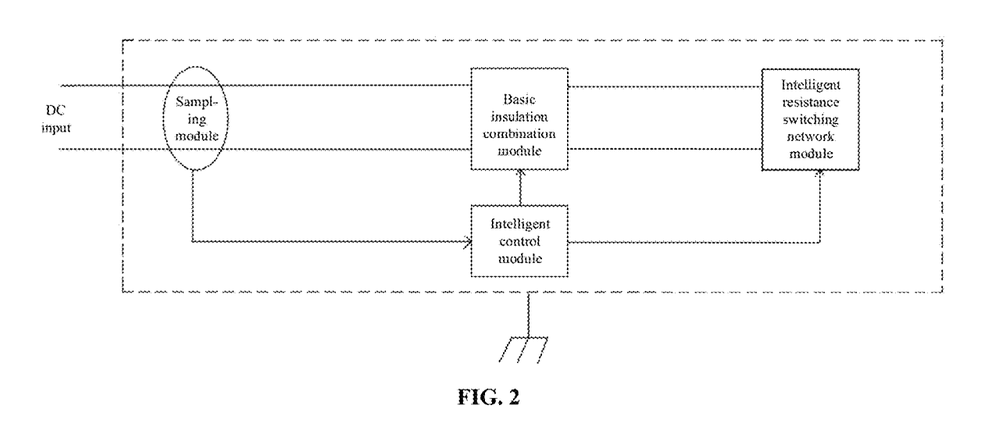
FIG. 2 is a schematic architecture diagram of a distributed insulation detection device for a multi-stage DC system according to a first embodiment of the present disclosure.

FIG. 2 shows a schematic structural diagram of the distributed insulation detection device for the multi-stage DC system according to this embodiment. In FIG. 2, the distributed insulation detection device for the multi-stage DC system includes an intelligent control module, and a sampling module, a basic insulation combination module and an intelligent resistance switching network module connected with the intelligent control module. The sampling module is configured to collect voltage data and/or leakage current data of the multi-stage DC system, and to transmit the voltage data and/or leakage current data to the intelligent control module. The basic insulation combination module is configured to detect a ground insulation fault of the multi-stage DC system. The intelligent resistance switching network module is configured to adjust a resistance value of the distributed insulation detection device of the multi-stage DC system. The intelligent control module is configured to process the voltage data and/or leakage current data, and to control the basic insulation combination module and the intelligent resistance switching network module to make adjustment. Herein, the intelligent control module is configured to control the basic insulation combination module and the intelligent resistance switching network module to make adjustment refers to: the intelligent control module controls the resistance values of the basic insulation combination module and the intelligent resistance switching network module, to adjust a total balance resistance of the distributed insulation detection device for the multi-stage DC system.

In this embodiment, the sampling module, the basic insulation combination module and the intelligent resistance switching network module in the distributed insulation detection device for the multi-stage DC system are respectively connected to a DC bus of the multi-stage DC system in any order. Referring to FIG. 2, the sampling module, the basic insulation combination module and the intelligent resistance switching network module are all connected to a positive line and a negative line of the DC bus of the multi-stage DC system. It should be noted that in this embodiment, the sequence of connecting the sampling module, the basic insulation combination module and the intelligent resistance switching network module to the DC bus includes but is not limited to the connection sequence shown in FIG. 2.

In this embodiment, the sampling module at least includes any one of a high-precision resistance voltage divider detection circuit and an operational amplifier gain detection circuit. The function of the sampling module is to collect a DC voltage and/or current in the multi-stage DC system. It should be noted that "at least includes" and "includes but is not limited to" may be interchanged in this embodiment, that is, other kinds of circuits may be included in addition to the above circuits.

In this embodiment, the intelligent control module includes a microcontroller unit (MCU) chip and peripheral communication, sampling and control circuits. The function of the intelligent control module is to process the voltage data and/or leakage current data, and to control the basic insulation combination module and the intelligent resistance switching network module to make adjustment.

Figure 3:
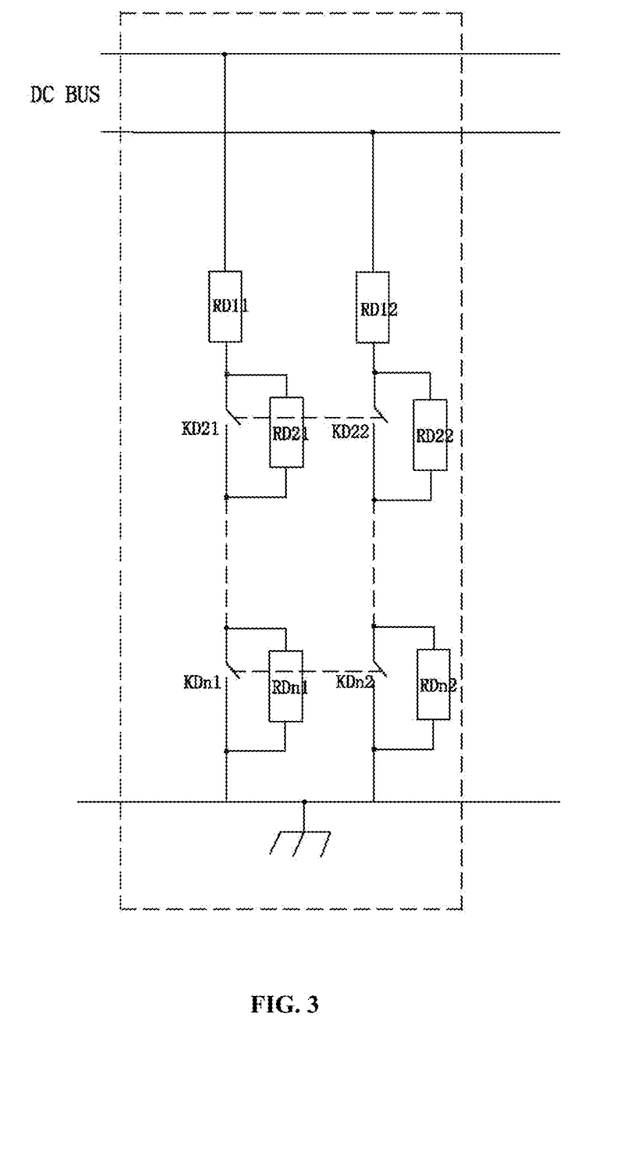
FIG. 3 is a schematic diagram of a circuit topology structure consisting of a series connection between a basic insulation combination module and an intelligent resistance switching network module according to the first embodiment of the present disclosure.

In this embodiment, the basic insulation combination module includes a first balanced resistor pair RD11 and RD12, a second balanced resistor pair RD21 and RD22, and a first switching switch pair KD21 and KD22. The second balanced resistor pair RD21 and RD22 is respectively correspond to and connected in parallel with the first switching switch pair KD21 and KD22. That is, the RD21 corresponds to and is connected in parallel with the KD21, the RD22 corresponds to and is connected in parallel with the KD22. The first balanced resistor pair RD11 and RD12 is respectively correspond to and connected in series with the second balanced resistor pair RD21 and RD22 and the first switching switch pair KD21 and KD22 which are respectively connected in parallel, and are respectively connected in series to a positive lead to ground and a negative lead to ground of the DC bus. The structure of the basic insulation combination module is shown in FIG. 3. The second balanced resistor pair RD21 and RD22 is respectively correspond to and connected in series with the first switching switch pair KD21 and KD22. That is, the RD21 corresponds to and is connected in series with the KD21, the RD22 corresponds to and is connected in series with the KD22. The first balanced resistor pair RD11 and RD12 is respectively correspond to and connected in parallel with the second balanced resistor pair RD21 and RD22 and the first switching switch pair KD21 and KD22 which are respectively connected in series, and are respectively connected in series to a positive lead to ground and a negative lead to ground of the DC bus. The structure of the basic insulation combination module is shown in FIG. 4.

Figure 4:
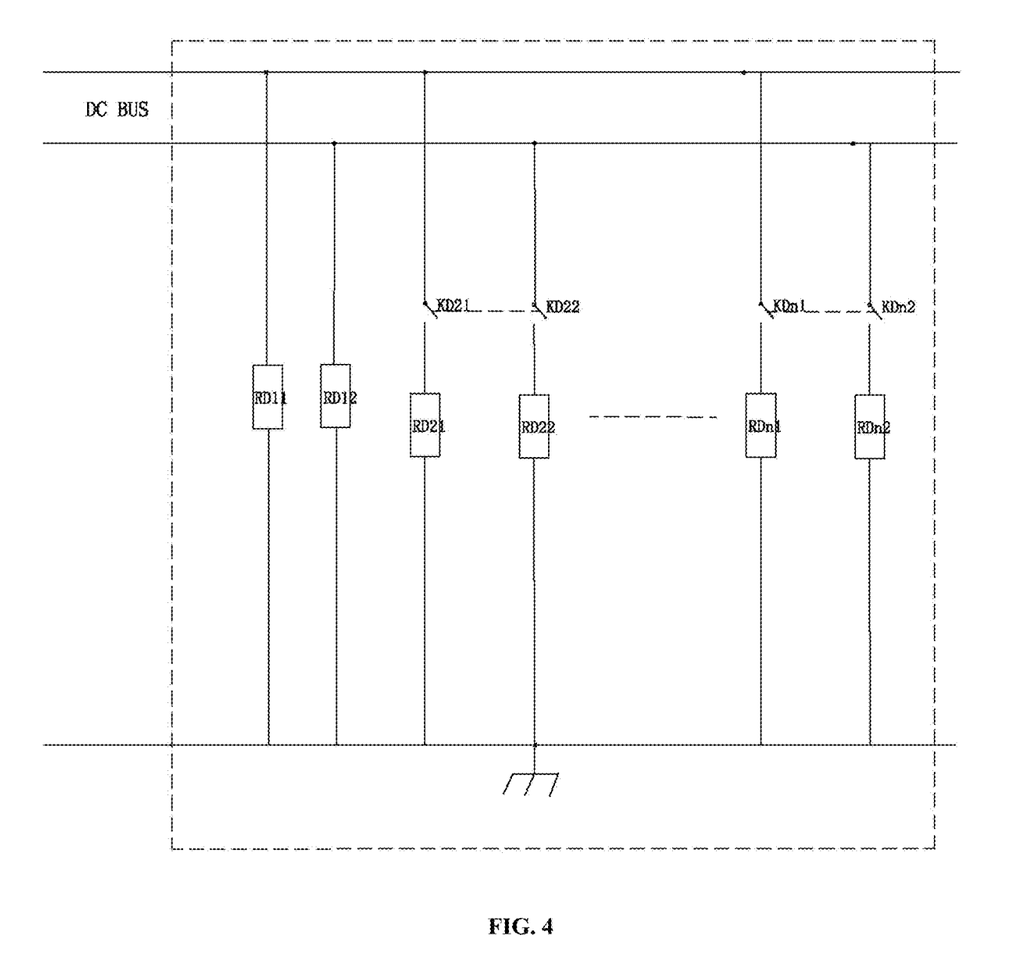
FIG. 4 is a schematic diagram of a circuit topology structure consisting of a parallel connection between the basic insulation combination module and the intelligent resistance switching network module according to the first embodiment of the present disclosure.

Referring to FIG. 3 and FIG. 4, when only the first balanced resistor pair RD11 and RD12 are connected into the forgoing basic insulation combination module, the basic insulation combination module is configured to detect a single-ended ground insulation fault by a balanced bridge method. When the first balanced resistor pair RD11 and RD12, the second balanced resistor pair RD21 and RD22, and the first switching switch pair KD21 and KD22 are all connected into the basic insulation combination module, the basic insulation combination module is configured to detect a double-ended ground insulation fault by an unbalanced bridge method.

In this embodiment, resistance values of the first balanced resistor pair RD11 and RD12 are equal and determined by the voltage data and/or leakage current data of the multi-stage DC system. Resistance values of the second balanced resistor pair RD21 and RD22 are equal, and are equal to or greater than four times the resistance values of the first balanced resistor pair RD11 and RD12, which may be seen in FIG. 3 and FIG. 4.

In this embodiment, the intelligent resistance switching network module includes at least one pair RD31 and RD32 of first functional resistor pairs, and a corresponding first functional switch pair KD31 and KD32. The first functional resistor pair RD31 and RD32 are respectively corresponding to and connected in parallel with the first functional switch pair KD31 and KD32, and are respectively connected in series to the positive lead to ground and the negative lead to ground of the DC bus. The structure of the intelligent resistance switching network module is shown in FIG. 3. The first functional resistor pair RD31 and RD32 are respectively corresponding to and connected in series with the first functional switch pair KD31 and KD32, and are respectively connected in series to the positive lead to ground and the negative lead to ground of the DC bus. The structure of the intelligent resistance switching network module is shown in FIG. 4. It should be noted that, in this embodiment, the first functional resistor pairs include the at least one pair of RD31 and RD32. In practical applications, the number of the first functional resistor pairs is determined by comprehensive consideration according to actual requirements, including but not limited to: the first functional resistor pair RD31 and RD32, ..., an n-th functional resistor pair RDn1 and RDn2. Correspondingly, since the first functional switch pair KD31 and KD32 are in one-to-one correspondence with the first functional resistor pair RD31 and RD32, the first functional switch pairs include, but are not limited to, the first functional switch pair KD31 and KD32, ..., and an n-th functional switch pair KDn1 and KDn2.

In this embodiment, the basic insulation combination module and the intelligent resistance switching network module are connected in series or in parallel through a respective correspondence. FIG. 3 and FIG. 4 may be referred to for details. FIG. 3 is a schematic diagram of a circuit topology structure including a series connection between the basic insulation combination module and the intelligent resistance switching network module according to this embodiment. FIG. 4 is a schematic diagram of a circuit topology structure including a parallel connection between the basic insulation combination module and the intelligent resistance switching network module according to this embodiment.

In this embodiment, control signals of the at least one pair of the first functional switch pairs KD31 and KD32 as well as the first switching switch pair KD21 and KD22 are all controlled by the intelligent control module. Control manners include a joint control for the switch pair and an independent control for the switch pair. In this embodiment, the joint control for the switch pair means that a control for one switch in the switch pair may influence the other switch in the switch pair, so it is required to consider the mutual influence in the switch pair during control. The specific influence relationship between the switch pairs may be adjusted according to the actual situation, which is not limited in the present disclosure. The independent control for the switch pair means that a control for one switch in the switch pair is independent of the other switch in the switch pair and does not influence each other.

In this embodiment, for the at least one pair of the first functional switch pairs KD31 and KD32 as well as the first switching switch pair KD21 and KD22, the switching devices in the switch pairs include at least any one of a relay, a triode, an optocoupler, and a MOS transistor. It should be noted that in this embodiment, the selection of switching devices includes, but is not limited to, the devices listed above. In other embodiments, other devices capable of turning on and off may also be used as the switching devices in this embodiment.

In this embodiment, the resistance values of the at least one pair of the first functional resistor pairs RD31 and KD32 are equal, and a series-parallel combination value of all functional resistors configured in the same multi-stage DC system is greater than 20 times the resistance values of the first balanced resistor pair RD11 and RD12. It should be noted that in this embodiment, the series-parallel combination value includes a series connection value and a parallel connection value. The series connection value is a series combination value of functional resistors in the case that the basic insulation combination module and the intelligent resistance switching network module are connected in series. The parallel connection value is a parallel combination value of the functional resistors in the case that the basic insulation combination module and the intelligent resistance switching network module are connected in parallel.

This embodiment provides the distributed insulation detection device for the multi-stage DC system, which includes the intelligent control module, and the sampling module, the basic insulation combination module and the intelligent resistance switching network module connected with the intelligent control module. The sampling module is configured to collect the voltage data and/or leakage current data of the multi-stage DC system, and transmit the voltage data and/or leakage current data to the intelligent control module. The basic insulation combination module is configured to detect the ground insulation fault of the multi-stage DC system. The intelligent resistance switching network module is configured to adjust the resistance value of the distributed insulation detection device of the multi-stage DC system. The intelligent control module is configured to process the voltage data and/or leakage current data and to control the basic insulation combination module and the intelligent resistance switching network module to make adjustment. The ground insulation fault of the multi-stage DC system is detected by the basic insulation combination module, and the sampling module is used to collect the voltage data and/or leakage current data of the multi-stage DC system and transmit the collected voltage data and/or the leakage current data to the intelligent control module for data processing. Then the intelligent control module controls the resistance values of the basic insulation combination module and the intelligent resistance switching network module, to adjust a total balance resistance of the distributed insulation detection device for the multi-stage DC system, so as to avoid affecting the calculation accuracy of a bus insulation detection device of a parallel system.

Second Embodiment

Figure 5:
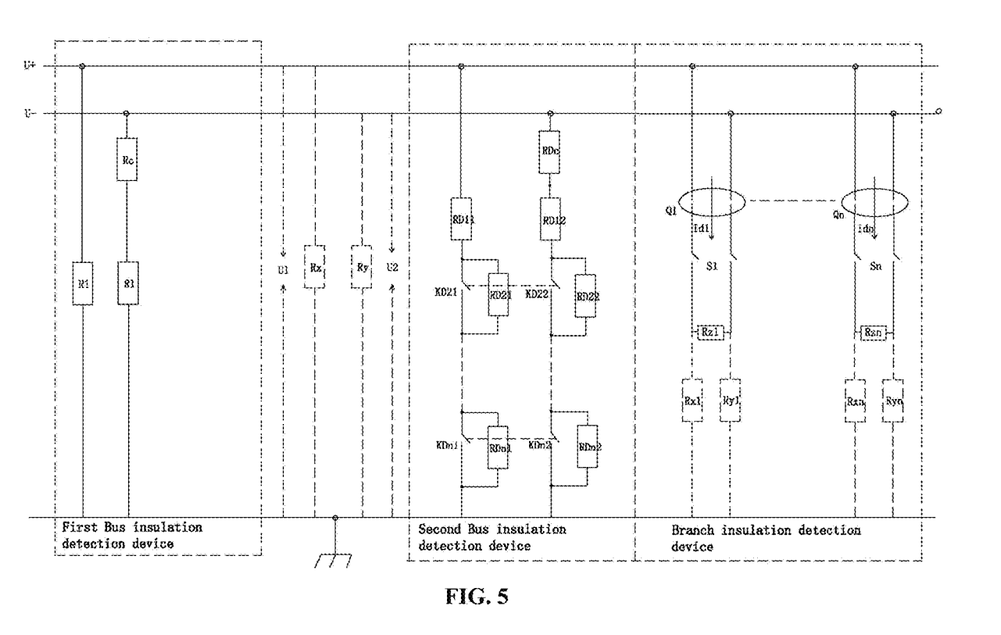
FIG. 5 is a schematic architecture diagram of a typical distributed DC power supply and distribution system according to a second embodiment of the present disclosure.

FIG. 5 shows a typical distributed DC power supply and distribution system. A first bus insulation detection device is a conventional insulation detection circuit; a second bus insulation detection device is a distributed insulation detection device for a multi-stage DC system described in this embodiment, and a branch insulation detection device mainly includes leakage Hall sensors.

A balanced bridge theory is to calculate an insulation resistor by measuring the change of positive and negative busbar voltages to ground. The resistance selection of a balanced bridge resistor and a switching resistor is required to avoid an excessive fluctuation of a voltage to ground based on ensuring certain detection sensitivity. Generally, the resistance of the balanced bridge resistor is slightly larger than an insulation alarm threshold, and a resistance of a switching resistor is not less than 4 times the resistance of the balanced bridge resistor. According to the communication industry standards YD/T 3089-2016 and YD/T 2378-2011 and other relevant regulations, an insulation alarm threshold of a 336V DC system is 38K by default, and an insulation alarm threshold of a 240V DC system is 28K by default. Therefore, in general, the resistance value of the balanced bridge of the 336V system ranges from 38 kΩ to 50 kΩ, and a balance resistance value of the 240 V system ranges from 28 kΩ to 40 kΩ.

In FIG. 5, R1 in the first insulation detection device, RD11 and RD12 in the second insulation detection device are balanced resistors. RD21 and RD22 in the second insulation detection device are balanced switching resistors. RDn1 and RDn2 are functional resistors. Rc and RDc are sampling resistors, and the resistance values may be ignored. It is assumed that a positive resistance to ground of the busbar is Rx, a negative resistance to ground of the busbar is Ry, and the positive and negative busbar voltages to ground are U1 and U2 respectively, and R1' and R2' are respectively set as the positive and negative total balanced bridge resistor to ground of a monitoring system. In the case that the monitoring of a power supply system only considering its own first insulation detection device, then theoretically there are R1'=R1 and R2'=R1. However, in the case that the first insulation detection device of the power supply system is actually connected in parallel with the second insulation detection device of a power distribution system, there are R1'=R1//RD, and R2'=R1//RD (where "//" represents that two resistors are connected in parallel), where RD is a combined total resistance value of all the balanced resistors and functional resistors of the second insulation device. According to the balanced bridge theory, the theoretical and actual insulation resistance values in the above two cases are calculated respectively as follows: a theoretical value of Ry=R1*U2/(U1−U2) and an actual value of Ry=(R1//RD)*U2/(U1−U2). A relative error between the calculated theoretical value and the actual value φ=R1/RD*100%. It can be seen that the smaller the RD is than the value of R1, the larger the calculation error is. When RD is much larger than R1, the calculation error of the insulation resistance approaches 0%.

According to the national grid standard, a detection error of grounding resistance in the range of 0-100K shall be less than or equal to 5%, then the value range of RD may be obtained: RD≥20R1. Considering the circuit detection error, and too large the value of the functional resistance may affect the detection accuracy of the voltage to ground, it is recommended that the value of RD is between 20 R1 and 50 R1. The resistance value of the balanced bridge resistor R1 is determined by the DC system voltage according to the foregoing. Therefore, the resistance range of the first balanced bridge resistor pair RD11 and RD12 described in the present disclosure may also be obtained. The resistance values of the second balanced bridge resistor pair (i.e. balanced switching resistors) RD21 and RD22 are not less than 4 times the resistance values of the first balanced bridge resistor pair. The resistance values of the first functional resistor pair RD31 and RD32 may be greater than or equal to 20 times the resistance values of the first balanced bridge resistor pair. The resistance values of a second functional resistor pair may be 2 times the resistance values of the first functional resistor pair. The resistance values of a third functional resistor pair may be twice the resistance values of the second functional resistor pair, and so on. In practical applications, the number of functional resistor pairs to be configured may be determined according to the number of on-site parallel insulation devices. Based on this, in the embodiment of the present disclosure, the total balanced resistance value of the distributed insulation detection device for the multi-stage DC system designed may be flexibly configured through an intelligent resistance switching network module, so as to avoid affecting the calculation accuracy of the bus insulation detection device of the parallel system.

The distributed insulation detection device for the multi-stage DC system in this embodiment fully considers the mutual influence between parallel insulation detection devices in the DC power supply and distribution system, and proposes a general distributed insulation detection solution based on the principle of the conventional balanced bridge insulation detection circuit commonly used in engineering. The solution can not only independently detect an insulation resistance of the bus to ground, but also cooperate to detect an insulation resistance of a branch to ground. In independent applications, either a balanced bridge method or an unbalanced bridge method may be used to detect the double-ended grounding fault of the busbar and the branch.

The distributed insulation detection device for the multi-stage DC system according to the embodiment of the present disclosure is based on the balanced bridge theory and its changes. The formulas used for calculating the insulation resistances of the busbar and the branch are all first-order equations, which are simpler in calculation than the quadratic equation and have a fast response speed. And the resistance value ranges of the balanced bridge resistor, the switching resistor and the functional resistor have a certain proportional relationship, which may be specifically determined according to the DC system voltage.

Third Embodiment

This embodiment describes the distributed insulation detection device for the multi-stage DC system provided in the embodiments of the present disclosure based on an application scenario of a DC power supply system with a power distribution system output.

Figure 6:
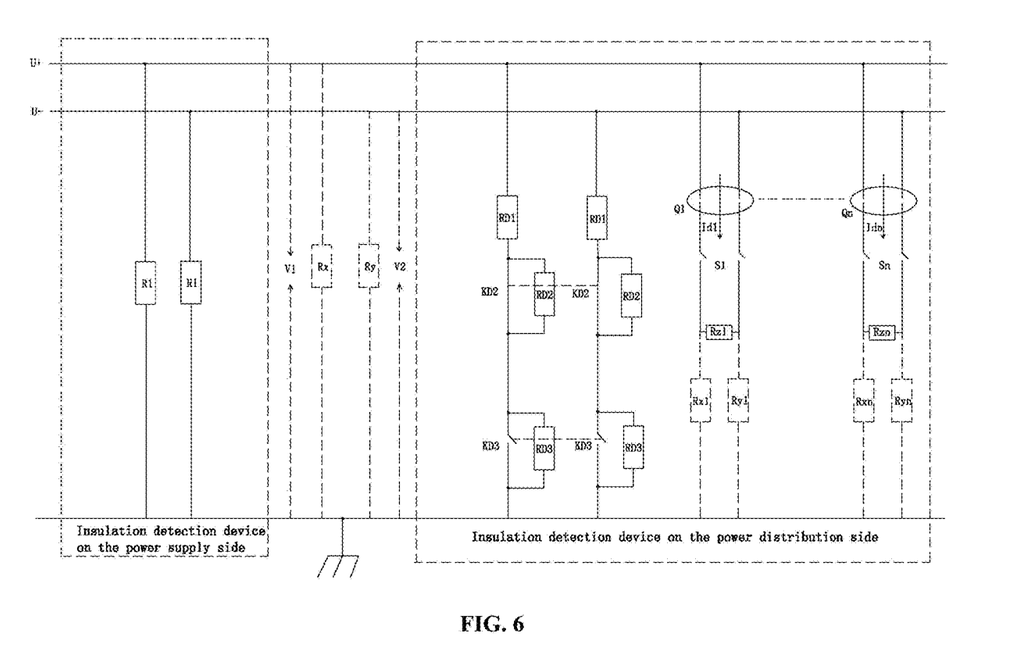
FIG. 6 is a simplified schematic diagram of an insulation detection device with a single DC power supply system being parallel to a single power distribution system output according to a third embodiment of the present disclosure.

Referring to FIG. 6, in this embodiment, an insulation detection device for a power distribution system uses the distributed insulation detection device for the multi-stage DC system provided in the embodiments of the present disclosure for a branch insulation detection. A power supply system is designed with a conventional balanced bridge insulation detection device for a bus insulation detection.

Assuming that a busbar voltage of the DC system is U=240V and its alarm threshold is 28K, in this case, the insulation detection device takes the values of the balanced bridge resistors as R1=RD1=30KΩ, the balanced switching resistor RD2=120KΩ and the functional resistor RDn=25(n−2)RD1. Considering that only two stages of insulation detection devices are connected in parallel in the DC system, only one set of functional resistor pair RD3=25RD1=750KΩ is required for the insulation detection device for the power distribution system. In practical applications, a switching switch KD2 is controlled to be ON and a KD3 is OFF. The simplified circuit is shown in FIG. 6.

The busbar is artificially provided with a positive insulation resistance to ground Rx=28K. The bus insulation detection device for the power supply system may detect the actual positive and negative busbar voltages to ground U1 and U2 according to the sampling resistor, which should be consistent with the following theoretical calculation values:

$$U1 = \frac{R1 // Rx // (RD1 + RD3)}{R1 // Rx // (RD1 + RD3) + R1 // (RD1 + RD3)} \times U = 79.2V$$

$$U2 = \frac{R1 // (RD1 + RD3)}{R1 // Rx // (RD1 + RD3) + R1 // (RD1 + RD3)} \times U = 160.8V$$

From U1<U2, it is judged that an insulation performance of the positive-to-ground is poor. At this time, if the insulation monitoring of the power supply system still only considering its own balanced bridge resistor and ignoring the influence of the insulation detection device for the DC power distribution system connected in parallel in the later stage, the calculated value of Rx is as follows:

$$Rx = \frac{R1 U1}{U2 - U1} = \frac{30 \times 79.02}{160.98 - 79.02} = 29.12K$$

Then a relative error between the theoretically calculated value of Rx and the actually given value of Rx is as follows:

$$\eta = \frac{|29.12 - 28|}{28} \times 100\% = 4\%$$

To sum up, it can be seen that the influence of the insulation detection device connected in parallel in the later stage described in the present disclosure on the insulation detection accuracy of the former stage busbar is controlled within the allowable error range of 5%, which meets the requirements.

For the branch insulation detection, the insulation detection device for the power distribution system samples and detects the values of the positive and negative voltage to ground, and a leakage Hall sensor is configured to detect a branch leakage current value. Assuming that there is a leakage current Id1 in a first branch, according to the balanced bridge theory, if the Id1 is positive, it means that the insulation performance of the positive-to-ground decreases, and an insulation resistance of positive-to-ground of the branch is Rx1=U1/ID1; if the Id1 is negative, it means that the insulation performance of the negative-to-ground decreases, and the insulation resistance of the negative-to-ground of the branch is Ry1=U2/Id1.

Fourth Embodiment

This embodiment describes the distributed insulation detection device for the multi-stage DC system provided in the embodiments of the present disclosure based on an application scenario of a DC power supply system with three power distribution system outputs.

Figure 7:
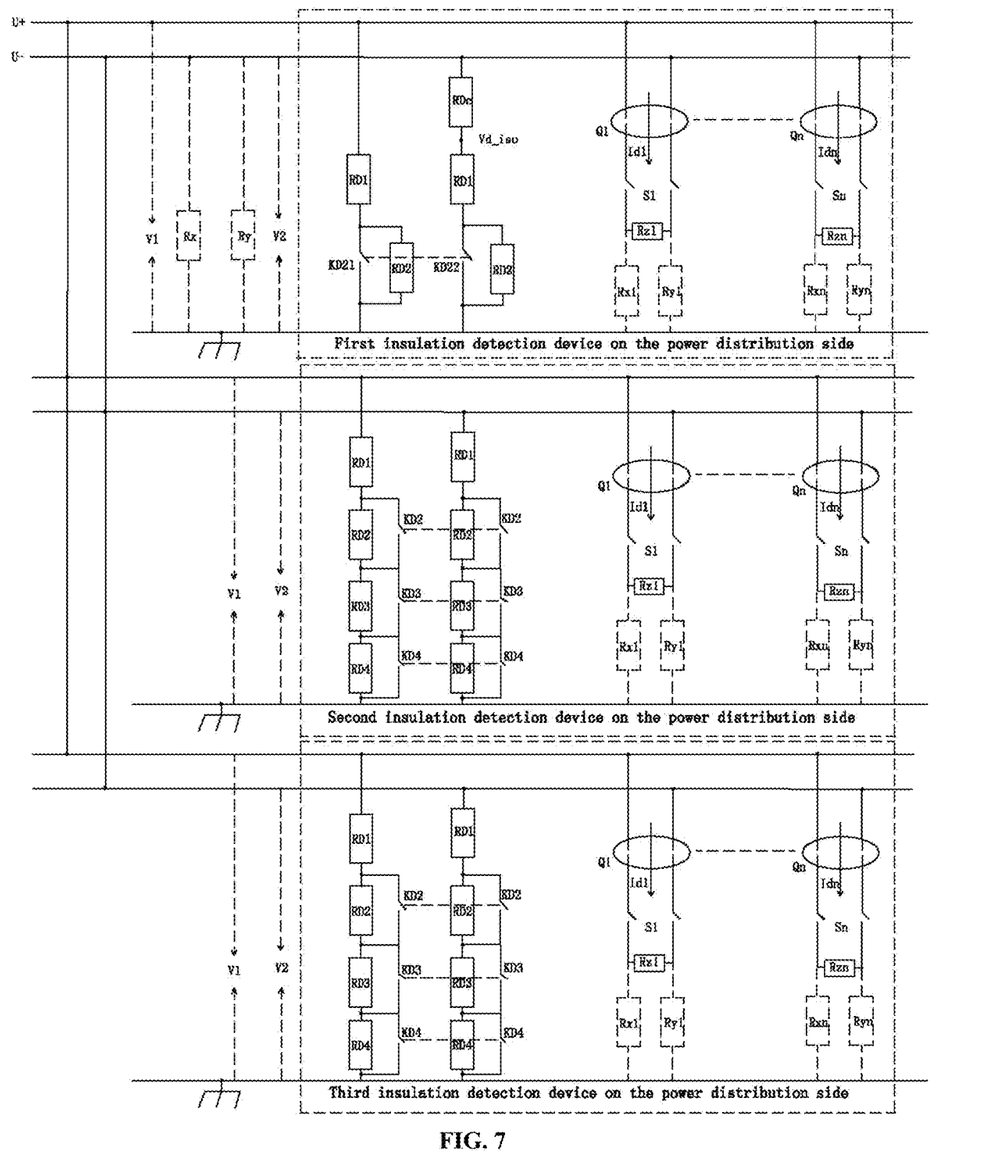
FIG. 7 is a simplified schematic diagram of an insulation detection device with a single DC power supply system being parallel to three power distribution system outputs according to a fourth embodiment of the present disclosure.

Referring to FIG. 7, in this embodiment, an insulation detection device for a power distribution system uses the distributed insulation detection device for the multi-stage DC system provided in the embodiments of the present disclosure, for insulation detections of the bus and the branch. A power supply system does not have an insulation detection device. Assuming that a busbar voltage of the DC system is U=240V and its alarm threshold is 28K, in this case, the insulation detection device takes the values of the balanced bridge resistors R1=RD1=30KΩ, the balanced switching resistor RD2=120KΩ and the functional resistor RDn=25(n−2)RD1. It is taken into consideration that there are three stages of insulation detection devices connected in parallel in the DC system, and all of them are insulation detection devices for the power distribution system. A first insulation detection device may be selected for a bus insulation detection. A second insulation detection device and a third insulation detection device may be cooperated for insulation detection of their corresponding branches. Thus, the first insulation detection device does not require a functional resistor pair, and a combined value of functional resistor pairs of the second insulation detection device and the third insulation detection device is required to be greater than or equal to 2*25RD1, which requires to configure two sets of functional resistor pairs RD3=25RD1=750KΩ and RD4=50RD1=1500KΩ. In practical applications, the first insulation detection device retains the functions of the basic insulation combination module, and the switching switch controls the second insulation detection device and the third insulation detection device according to an algorithm. The switching switch pair KD2 and KD3 are ON while KD4 is OFF. The simplified circuit is shown in FIG. 7. It can be seen that the combined value of the functional resistor pairs of the second insulation detection device and the third insulation detection device connected in parallel is RD=(RD1+RD4)/2=765KΩ.

For the busbar insulation detection, in this case, the first insulation detection device for the power distribution system uses the unbalanced bridge insulation detection method to detect the double-ended grounding fault. In this case, if the first insulation detection device still only considering its own system when monitoring and calculating, but ignoring the influence of a parallel resistance of the insulation detection device, its theoretical calculation formula is as follows.

Figure 8:
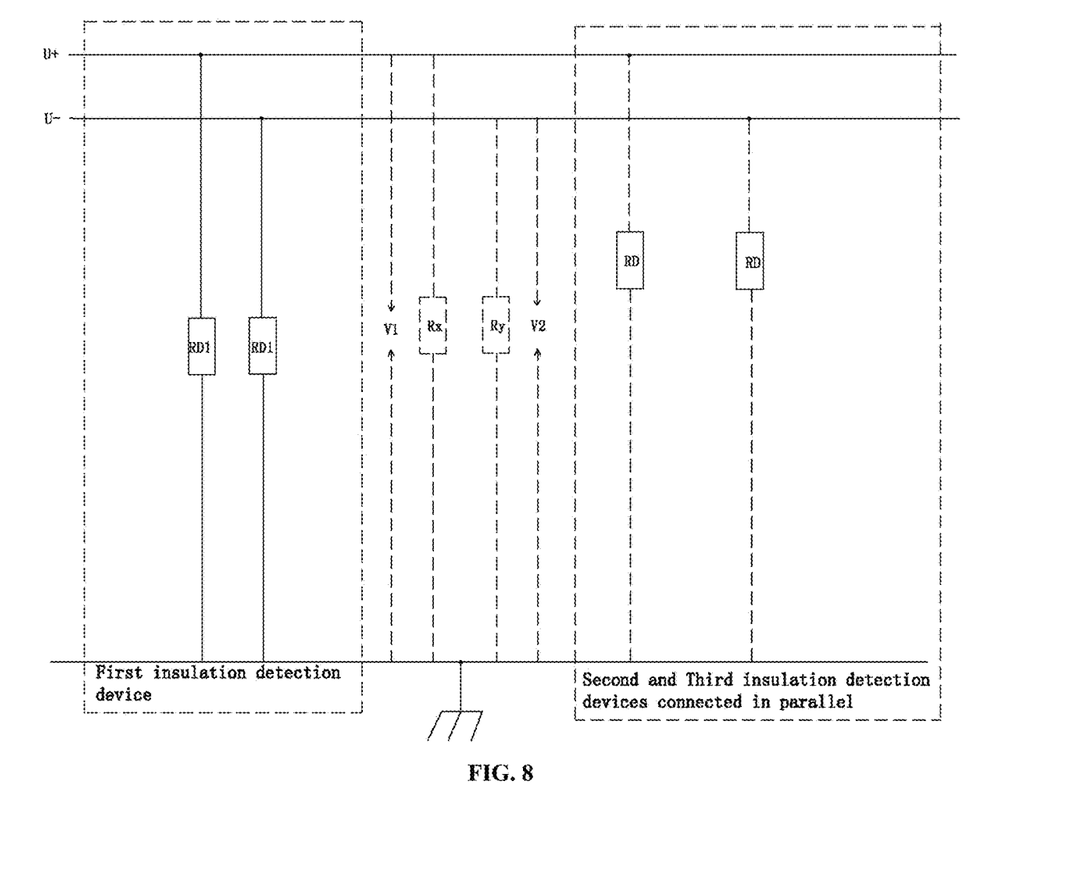
FIG. 8 is a simplified circuit diagram of a distributed insulation detection device for a multi-stage DC system which uses an unbalanced bridge insulation detection method to detect a double-ended grounding fault in a first state according to the fourth embodiment of the present disclosure.

In a first state, both KD21 and KD22 are ON, as shown in FIG. 8, regardless of RD, there are:

$$\frac{U11}{Rx // RD1} = \frac{U12}{Ry // RD1} \quad (1)$$

Figure 9:
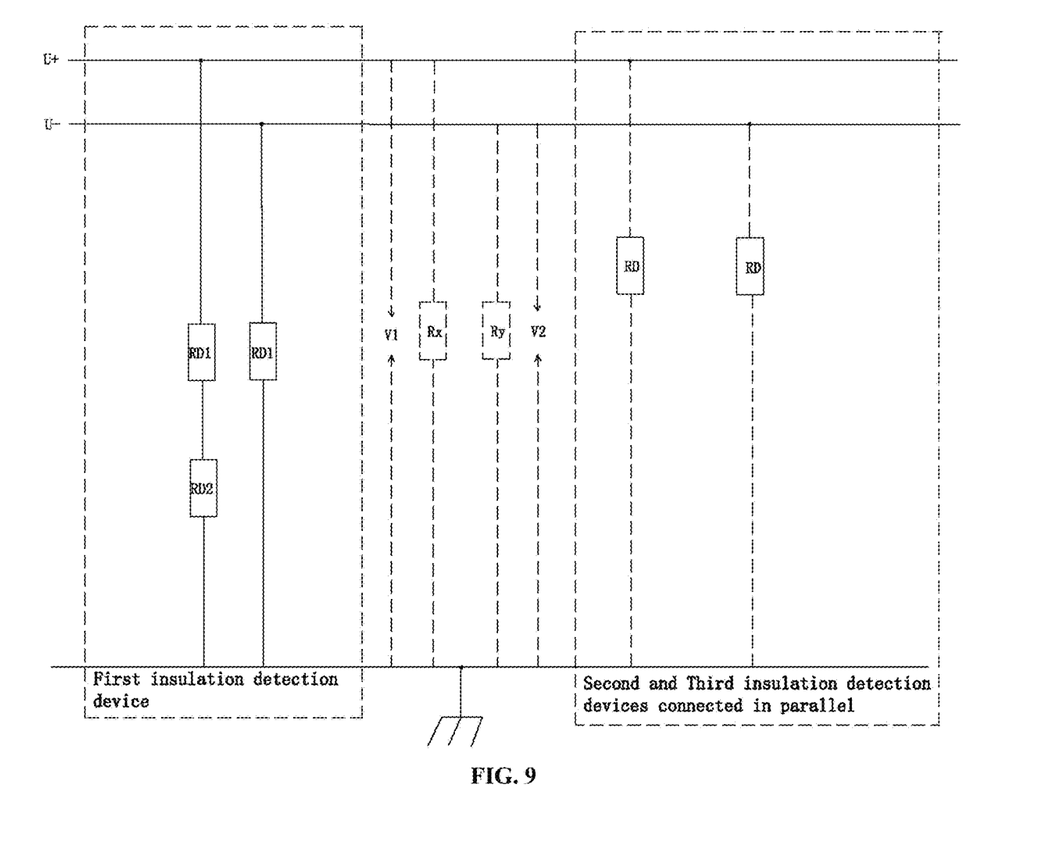
FIG. 9 is a simplified circuit diagram of the distributed insulation detection device for the multi-stage DC system which uses the unbalanced bridge insulation detection method to detect the double-ended grounding fault in a second state according to the fourth embodiment of the present disclosure.

In a second state, KD21 is OFF and KD22 is ON, as shown in FIG. 9, regardless of RD, there are:

$$\frac{U21}{Rx // (RD1 + RD2)} = \frac{U22}{Ry // RD1} \quad (2)$$

Figure 10:
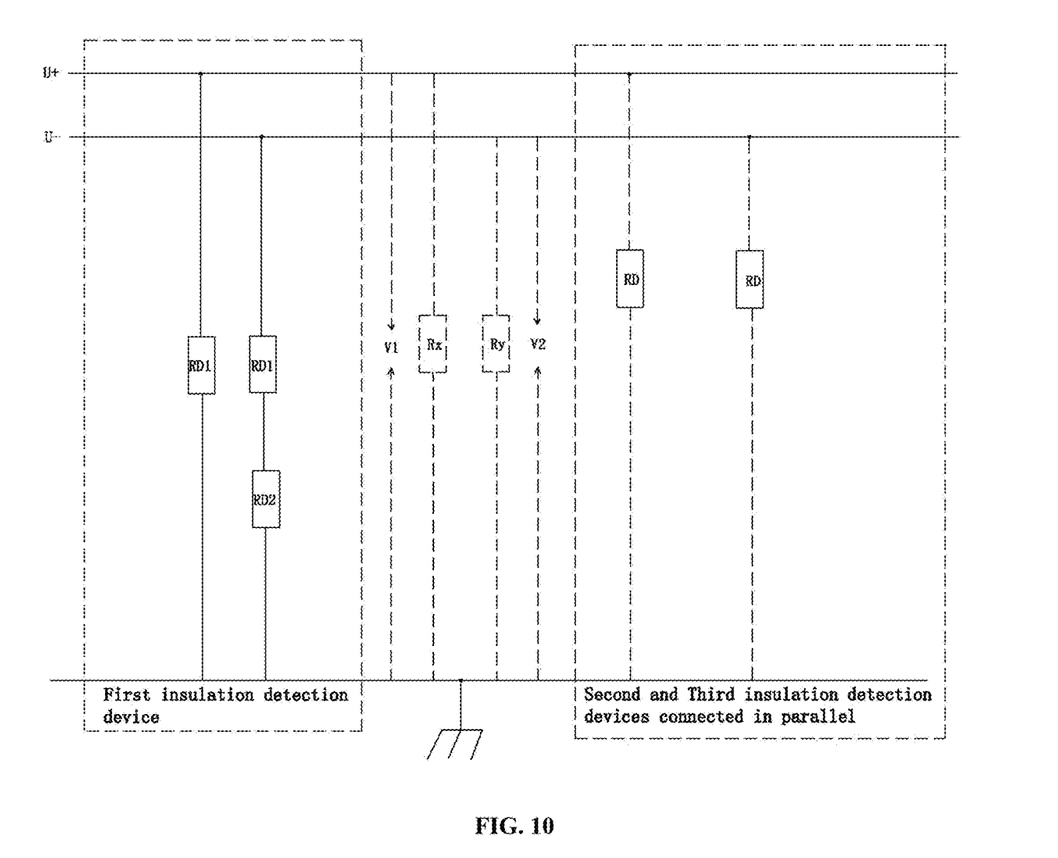
FIG. 10 is a simplified circuit diagram of the distributed insulation detection device for the multi-stage DC system which uses the unbalanced bridge insulation detection method to detect the double-ended grounding fault in a third state according to the fourth embodiment of the present disclosure.

In a third state, KD21 is ON and KD22 is OFF, as shown in FIG. 10, regardless of RD, there are:

$$\frac{U31}{Rx//RD1} = \frac{U32}{Ry//(RD1+RD2)} \quad (3)$$

By combining the above formulas (1)~(3), the theoretical calculation formulas of Rx and Ry may be obtained. Herein, U11~U31 and U12~U32 are the values of the positive and negative voltage to ground in the corresponding state respectively.

In this case, if the values of the resistance to ground Rx=30KΩ and Ry=30KΩ being given, and considering the resistance value RD of the parallel insulation device, the actual values of the positive and negative voltage to ground of the first state to the third state may be calculated as: U11=120V, U12=120V; U21=149.29V, U22=90.71V; U31=90.71, U32=149.29V. By substituting the values of the positive and negative voltage to ground in each state into the theoretical calculation formula of RX and RY, it may be obtained that Rx=Ry=28.9KΩ.

Then a relative error between the values of Rx and Ry theoretically calculated by the unbalanced bridge method and the actually given values of Rx and Ry is as follows:

$$\eta = \frac{|28.9-30|}{30} \times 100\% = 3.67\%$$

To sum up, it can be seen that the unbalanced bridge insulation detection method may also be used to detect the double-ended grounding fault, in the case that the distributed insulation detection devices for the multi-stage DC system provided in the embodiments of the present disclosure are connected in parallel, and the detection accuracy meets the requirements.

For the branch insulation detection, similarly, the balanced bridge resistors in the bus insulation detection device of the power distribution system may form a loop to sample the values of the positive and negative voltages to ground according to the similar principle of the unbalanced bridge. The leakage Hall sensor is configured to detect a branch leakage current value. Two states in the unbalanced bridge method are used for calculation, such as the first state and the second state. Assuming that there is a leakage current Id11 in the first state and a leakage current Id12 in the second state, the following formula may be listed:

$$\frac{V11}{Rx1} - \frac{V12}{Ry1} = Id11 \quad (4)$$

$$\frac{V21}{Rx1} - \frac{V22}{Ry1} = Id12 \quad (5)$$

By combining the formulas (4) and (5), the insulation resistance values Rx1 and Ry1 of both ends of the branch may be obtained.

Those skilled in the art shall understand that all or some of the operations in the method disclosed above and the functional modules/units in the system and the apparatus can be implemented as software (which can be realized by computer program codes executable by computing devices), firmware, hardware and an appropriate combination thereof. In the hardware implementation, division between functional modules/units mentioned in the above description does not necessarily correspond to division of physical components. For example, one physical component may have multiple functions, or one function or step may be implemented by several physical components. Some physical components or all physical components may be implemented as software executed by a processor, such as a central processing unit, a digital signal processor, or a microprocessor, or may be implemented as hardware, or may be implemented as an integrated circuit, for example, an application specific integrated circuit.

In addition, as is well known to those having ordinary skills in the art, the communication medium usually includes computer-readable instructions, data structures, program modules, or other data in a modulated data signal such as a carrier wave or other transmission mechanisms, and may include any information delivery medium. Therefore, the present disclosure is not limited to any specific combination of hardware and software.

The above content is a further detailed description of the embodiments of the present disclosure in combination with the specific implementations, and it may not be considered that the specific implementations of the present disclosure are limited to these descriptions. Those having ordinary skills in the art to which the present disclosure belongs may make some simple deductions or substitutions without departing from the concept of the present disclosure, such deductions or substitutions, however, fall within the protection scope of the present disclosure.

What is claimed is:

1. A distributed insulation detection device for a multi-stage direct current (DC) system, comprising:
   an intelligent control module, and
   a sampling module, a basic insulation combination module and an intelligent resistance switching network module connected with the intelligent control module; wherein:
   the sampling module is configured to collect voltage data and leakage current data of the multi-stage DC system, and to transmit the voltage data and the leakage current data to the intelligent control module;
   the basic insulation combination module is configured to detect a ground insulation fault of the multi-stage DC system;
   the intelligent resistance switching network module is configured to adjust a resistance value of the distributed insulation detection device of the multi-stage DC system; and
   the intelligent control module is configured to process the voltage data and the leakage current data, and to control the basic insulation combination module and the intelligent resistance switching network module to make adjustment;
   wherein the sampling module, the basic insulation combination module and the intelligent resistance switching network module are respectively connected to a DC bus of the multi-stage DC system in any order; and
   wherein the basic insulation combination module comprises: a first balanced resistor pair RD11 and RD12, a second balanced resistor pair RD21 and RD22, and a first switching switch pair KD21 and KD22; wherein:
   the second balanced resistor pair RD21 and RD22 are respectively corresponding to and connected in parallel with the first switching switch pair KD21 and KD22;
   the first balanced resistor pair RD11 and RD12 are respectively corresponding to and connected in series with the second balanced resistor pair RD21 and RD22 and the first switching switch pair KD21 and KD22 that are respectively connected in parallel and are further respectively connected in series to a positive lead to ground and a negative lead to ground of the DC bus.

2. The distributed insulation detection device for the multi-stage DC system according to claim 1, wherein the sampling module at least comprises any one of a high-precision resistance voltage divider detection circuit and an operational amplifier gain detection circuit.

3. The distributed insulation detection device for the multi-stage DC system according to claim 1, wherein the intelligent control module comprises a microcontroller unit (MCU) chip, and peripheral communication, sampling and control circuits.

4. The distributed insulation detection device for the multi-stage DC system according to claim 1, wherein:
in a case that only the first balanced resistor pair RD11 and RD12 are connected into the basic insulation combination module, the basic insulation combination module is configured to detect a single-ended ground insulation fault by a balanced bridge method; and
in a case that the first balanced resistor pair RD11 and RD12, the second balanced resistor pair RD21 and RD22, and the first switching switch pair KD21 and KD22 are all connected into the basic insulation combination module, the basic insulation combination module is configured to detect a double-ended ground insulation fault by an unbalanced bridge method.

5. The distributed insulation detection device for the multi-stage DC system according to claim 1, wherein:
resistance values of the first balanced resistor pair RD11 and RD12 are equal and determined by the voltage data and the leakage current data of the multi-stage DC system; and
resistance values of the second balanced resistor pair RD21 and RD22 are equal, and are equal to or greater than four times the resistance values of the first balanced resistor pair RD11 and RD12.

6. The distributed insulation detection device for the multi-stage DC system according to claim 1, wherein the intelligent resistance switching network module comprises: at least one pair RD31 and RD32 of first functional resistor pairs, and a corresponding first functional switch pair KD31 and KD32; and
the first functional resistor pair RD31 and RD32 are respectively corresponding to and connected in parallel with the first functional switch pair KD31 and KD32, and are further respectively connected in series to a positive lead to ground and a negative lead to ground of the DC bus.

7. The distributed insulation detection device for the multi-stage DC system according to claim 1, wherein the basic insulation combination module and the intelligent resistance switching network module are connected in series through a respective correspondence.

8. The distributed insulation detection device for the multi-stage DC system according to claim 6, wherein control signals of the at least one pair of the first functional switch pairs KD31 and KD32 are all controlled by the intelligent control module, and the control modes comprise at least one of a joint control for switch pairs and an independent control for switch pairs.

9. The distributed insulation detection device for the multi-stage DC system according to claim 6, wherein the resistance values of the at least one pair of the first functional resistor pairs RD31 and RD32 are equal, and a series-parallel combination value of all functional resistors configured in the same multi-stage DC system is greater than 20 times resistance values of first balanced resistor pair RD11 and RD12 in the basic insulation combination module.

10. The distributed insulation detection device for the multi-stage DC system according to claim 1, wherein the basic insulation combination module and the intelligent resistance switching network module are connected in parallel through a respective correspondence.

11. The distributed insulation detection device for the multi-stage DC system according to claim 10, wherein switching devices in switch pairs comprise at least any one of a relay, a triode, an optocoupler, and a MOS transistor.

12. The distributed insulation detection device for the multi-stage DC system according to claim 1, wherein control signals of the first switching switch pair KD21 and KD22 are all controlled by the intelligent control module, and the control modes comprise at least one of a joint control for switch pairs and an independent control for switch pairs.

13. The distributed insulation detection device for the multi-stage DC system according to claim 12, wherein switching devices in switch pairs comprise at least any one of a relay, a triode, an optocoupler, and a MOS transistor.

14. The distributed insulation detection device for the multi-stage DC system according to claim 1, wherein the intelligent control module is configured to process the voltage data and the leakage current data, and to control the basic insulation combination module and the intelligent resistance switching network module to make adjustment includes:
the intelligent control module is configured to control resistance values of the basic insulation combination module and the intelligent resistance switching network module, to adjust a total balance resistance of the distributed insulation detection device for the multi-stage DC system.

* * * * *